US008527832B2

(12) United States Patent
Savin

(10) Patent No.: US 8,527,832 B2
(45) Date of Patent: Sep. 3, 2013

(54) LDPC CODING PROCESS WITH INCREMENTAL REDUNDANCY

(75) Inventor: Valentin Savin, Grenoble (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 230 days.

(21) Appl. No.: 12/963,218

(22) Filed: Dec. 8, 2010

(65) Prior Publication Data

US 2011/0138260 A1   Jun. 9, 2011

(30) Foreign Application Priority Data

Dec. 9, 2009   (FR) .................................... 09 58787

(51) Int. Cl.
*H03M 13/00*   (2006.01)
(52) U.S. Cl.
USPC .......................................... 714/755
(58) Field of Classification Search
None
See application file for complete search history.

(56) References Cited

U.S. PATENT DOCUMENTS

| 4,888,774 | A   | * | 12/1989 | Kosuge et al. | 714/761 |
| 7,904,792 | B2  | * | 3/2011  | Kim et al.    | 714/774 |
| 8,055,987 | B2  | * | 11/2011 | Jeong et al.  | 714/801 |
| 8,190,967 | B2  | * | 5/2012  | Hong et al.   | 714/758 |
| 2008/0288846 | A1 | * | 11/2008 | Kyung et al. | 714/752 |

FOREIGN PATENT DOCUMENTS

| WO | WO 2006/039801 A1 | 4/2006 |
| WO | WO 2008/129195 A1 | 10/2008 |

OTHER PUBLICATIONS

French Search Report issued Jul. 7, 2010, in Patent Application No. FR 0958787 (with English Translation of Category of Cited Documents).
Noah Jacobsen, et al., "Design of rate-compatible irregular LDPC codes based on edge growth and parity splitting", Vehicular Technology Conference, XP 002589811, Oct. 30, 2007, pp. 1052-1056.
Jong-Ee Oh, et al., "Row-splitting design of Low-Density Parity-Check Codes for Gbps wireless transmission", Wireless Broadband and Ultra Wideband Communications, XP 002589812, Aug. 30, 2007, 5 pages.
Jing Li, et al., "Rate-Compatible Low Density Parity Check Codes for Capacity-Approaching ARQ Schemes in Packet Data Communications", Proceedings of Communications, Internet and Information Technology Conference, XP 002589813, Nov. 20, 2002, pp. 201-206.
Mohamed Shaqfeh, et al., "Systematic Modification of Parity-Check Matrices for Efficient Encoding of LDPC Codes", Communications, IEEE International Conference, XP 002589814, Jun. 28, 2007, pp. 945-950.

(Continued)

*Primary Examiner* — Michael Maskulinski
(74) *Attorney, Agent, or Firm* — Oblon, Spivak, McClelland, Maier & Neustadt, L.L.P.

(57) ABSTRACT

The invention relates to a coding method with incremental redundancy in which it is determined (620) whether to carry out the coding of a sequence of information symbols using a first code (C), of the LDPC type, defined by a first check matrix, H, or rather using a second code ($\tilde{C}$), of lesser efficiency than that of the first code, the second code being defined by a second check matrix, $\tilde{H}$, obtained by fractionation (630) of the rows of the first check matrix. The invention finds application to, among others, a link adaptation method, a turbo-coding method, a distributed coding method within a cooperative network, a packet transmission method using an IR-HARQ protocol.

8 Claims, 8 Drawing Sheets

(56) References Cited

OTHER PUBLICATIONS

Sang Hoon Lee, et al., "Serial Concatenation of LDPC and Turbo Code for the Next Generation Mobile Communications", Wireless and Optical Communications Networks, XP 002589815, Jun. 16, 2005, pp. 425-427.

Peyman Razaghi, et al., "Bilayer Low-Density Parity-Check Codes for Decode-and-Forward in Relay Channels", IEEE Transactions on Information Theory, vol. 53, No. 10, XP 002589816, Oct. 2007, pp. 3723-3739.

* cited by examiner

|     |   |   |   |   |   |   |   |   |
|-----|---|---|---|---|---|---|---|---|
| $R_1$ | 1 |   | 1 | 1 |   | 1 |   |   |
| $R_2$ | 1 | 1 |   | 1 | 1 |   | 1 | 1 |
| $R_3$ |   | 1 | 1 | 1 |   | 1 |   | 1 |
| $R_4$ | 1 |   | 1 | 1 | 1 |   | 1 | 1 |

Fig. 5A

| | | | | | | | | | | | | |
|---|---|---|---|---|---|---|---|---|---|---|---|---|
| $L_1$ | 1 |   |   | 1 |   |   |   | 1 |   |   |   |   |
| $L_2$ |   |   | 1 |   |   | 1 |   | 1 |   |   |   |   |
| $L_3$ |   | 1 |   |   |   |   | 1 |   | 1 |   |   |   |
| $L_4$ |   |   |   |   | 1 |   |   | 1 |   | 1 |   |   |
| $L_5$ | 1 |   |   | 1 |   |   |   |   | 1 | 1 |   |   |
| $L_6$ |   |   | 1 |   |   | 1 |   |   | 1 |   | 1 |   |
| $L_7$ |   | 1 |   | 1 |   |   |   |   |   |   |   | 1 |
| $L_8$ |   |   |   |   |   |   | 1 |   | 1 |   | 1 | 1 |
| $L_9$ | 1 |   | 1 |   |   |   |   | 1 |   |   | 1 | 1 |
| $L_{10}$ |   |   | 1 |   |   |   | 1 |   |   |   | 1 | 1 |
| $L_{11}$ |   |   | 1 |   | 1 |   | 1 |   | 1 |   |   |   | 1 |
| $L_{12}$ |   |   |   |   | 1 |   |   |   |   |   | 1 |   | 1 | 1 |

Fig. 5B

LDPC CODING PROCESS WITH INCREMENTAL REDUNDANCY

TECHNICAL FIELD

The present invention relates to the field of binary or non-binary LDPC (Low Density Parity Check) codes. It also relates to error-correcting codes or ECC with incremental redundancy.

The present invention can be applied to many fields, such as Link Adaptation type telecommunication systems, turbo-coding, distributed coding within a cooperative network, systems using the HARQ (Hybrid Automatic Repeat reQuest) communication protocol.

PRIOR STATE OF THE ART

LDPC codes were introduced by R. Gallager in his paper entitled "Low density parity check codes" published in IEEE Trans. Inform. Theory, Vol. IT-8, pages 21-28, 1962, and their interesting properties were only recently rediscovered when the power of iterative decoding was highlighted in turbo-codes.

LDPC codes are especially attractive in that they not only allow attainment of a correction capability approaching the Shannon limit, but also offer the best possible compromise between efficiency and performance (near the Gilbert-Varsharmov bound).

It is known that LDPC codes are linear codes with the property of having parity control matrices (called more simply "control matrices") with a low density of nonzero elements. Recall that a linear code C is defined by its generating matrix G or dually by its parity matrix H with $HG^T=0$. X is a word in code C if and only if $HX^T=0$.

LDPC codes are amenable to representation by a bipartite graph. A bipartite graph, so called, is an undirected graph whose vertex set consists of two disjoint subsets such that no two vertices of the same subset are connected by an edge of the graph.

The bipartite graph associated with an LDPC code is partitioned into a first subset of vertices associated with the symbols constituting a code word, called variable vertices, and a second subset of vertices associated with code constraints, typically the parity checks, called check vertices. A bipartite graph associated with a group of constraints is also called a Tanner graph. More specifically, variable vertices correspond to the columns and check vertices to the rows of the check matrix. Thus, a check vertex is connected to a variable vertex by an edge of the graph if, and only if the corresponding coefficient of the check matrix is nonzero, in other words the incidence matrix of the graph corresponds to the check matrix of the code. Equivalently, the variable vertices represent code bits (or symbols if the code is non-binary), and the check vertices represent linear checks, also called parity constraints, of the code.

Shown in FIG. 1 is the bipartite graph of a binary code defined by a check matrix H. It is noted that the graph includes six variable vertices, $X_1, \ldots, X_6$, representing the six bits of the code, and three check vertices, $Y_1, \ldots, Y_3$ representing the three parity constraints that apply to these six bits.

LDPC codes can be decoded by means of a message-passing iterative decoding method, also called MP (for Message Passing) or BP (Belief Propagation) type. A generic description of this decoding method can be found in N. Wiberg's thesis entitled "Codes and decoding on general graphs," 1996. Iterative message-passing decoding is in fact a generalization of algorithms well known in the field of decoding, to with the "forward-backward" algorithm used for turbo-codes and the Gallager algorithm used for LDPC codes. The message transmitted by a variable vertex to a check vertex represents the "belief" of the variable vertex regarding the value of value of the corresponding coded bit (or coded symbol, when a non-binary code is involved). Conversely, the message transmitted by a check vertex to a variable vertex represents the "belief" of the check vertex regarding the value of the coded bit (or coded symbol, when a non-binary code is involved) corresponding to the receiving variable vertex. In practice, these messages are defined in terms of probabilities, or of logarithmic likelihood ratios (LLR).

Many LDPC code decoding algorithms have been proposed within the state of the art. They differ either in the nature of the messages exchanged (probabilities, LLR), or in the manner in which they are calculated, or by the binary or non-binary nature of the code. One can mention non-exhaustively the "Sum-Product," "Min-Sum," "Min-Max," "Erasure Decoding," etc. decoding algorithms. For example, a "Min-Max" type decoding method was described by V. Savin in the article "Min-Max decoding for non-binary LDPC codes," published in the *IEEE Symposium on Information Theory* (ISIT), Toronto, Canada 2008.

The low density of nonzero elements in an LDPC code's check matrix is manifested by a low density of short cycles within the bipartite graph. These cycles tend to cause self-confirmation of the variables and the checks in an iterative decoding process. This means that an erroneous value of a vertex can be confirmed due to the simple fact that the messages transmitted to it by its neighbours are themselves dependent on the messages that this vertex transmits to them. To combat this self-confirmation phenomenon, the decoding process must adhere to the so-called extrinsic information principle: a message transmitted by a sending vertex to a receiving vertex is calculated from all the messages received by the sending vertex except that coming from the receiving vertex. However, adhesion to the extrinsic information principle does not exclude self-confirmation at higher orders, due to the cycles present in the bipartite graph, these self-confirmations being more frequent with shorter cycles.

Incremental redundancy error correction coding is also known in the state of the art. Such coding makes it possible to vary the degree of redundancy and hence the code throughput at will. The code's throughput (or efficiency) means the ratio of the number of bits (or symbols) of information to the number of bits (or symbols) of code. Thus, in the case of a systematic binary code, if i is the number of bits of information and if p is the number of parity bits, the code's throughput is $$R = \frac{i}{i+p}.$$

A first known means of varying the throughput of a code is to truncate it at a greater or lesser rate of truncation. For example, if (I,P) is a systematic code where/represents the information bits and P the parity bits, the truncation of the parity bits at different rates makes it possible to incrementally vary the redundancy of the code.

A second known means of making an incrementally redundant code is to concatenate a variable number of elementary codes, also called code components, either serially or in parallel.

FIG. 2 illustrates an example of incremental coding in which the number of parallel components can be varied. More specifically, a turbo-code is represented here where/is the systematic part and where $P_1$, $P_2$, $P_3$, represent the parity bits supplied respectively by a first, a second and a third recursive systematic coder designated by $RSC_1$, $RSC_2$ and $RSC_3$. The information bits are interleaved by a first interleaver $\Pi_1$ at the input of the second systematic recursive coder $RSC_1$, then by a second systematic recursive interleaver $\Pi_2$ at the input of the third systematic recursive coder $RSC_2$.

The bits constituting parts $I, P_1, P_2, P_3$ are for example then supplied to a binary-to-symbol modulator. As represented symbolically by switches $sw_1$, $sw_2$, $sw_3$, it is possible to select the various components of the turbo-code, to transmit or not the parity bits $P_2$ for example.

Another example of incremental redundancy coding can be illustrated in the context of a cooperative network. Recall that a cooperative network is a network in which information transmitted by a source terminal s to a destination terminal d can be relayed by one (or more) relay terminal(s). Different cooperation strategies have been considered in the literature, in particular according to the type of information relayed by the terminal and the type of multiplexing between the information relayed and the information belonging to the relay terminal.

We have shown in FIG. 3 an example of a cooperation strategy of the "decode and forward" type within a cooperative network, as proposed in the article of B. Zhao et al. entitled "Distributed turbo coded diversity for the relay channel," published in *IEEE Electronics Letters*, vol. 39, pages 786-787, May 2003.

The source terminal s transmits information bits I, using a first systematic code $C_1 = (I, P_1)$, to the destination terminal d, or in other words the code word $(I, P_1)$ where $P_1$ represents parity bits of the code. The relay terminal r also receives $(I, P_1)$, via the s-r Communication channel. Terminal r decodes the data received to recover the information bits I, and interleaves these information bits. The information thus interleaved, $\tilde{I}$, is encoded using a second systematic code $C_2 = (\tilde{I}, P_2)$. Parity bits $P_2$ are then transmitted to the recipient d.

It is understood that codes $C_1$ and $C_2$ constitute a parallel turbo-code $(I, P_1, P_2)$, distributed between the source terminal and the relay terminal. The destination terminal can then decode the data received by using an iterative decoding algorithm (turbo-decoding method).

Finally, incremental redundancy coding also finds application in mobile telecommunication systems of the HARQ (Hybrid Automatic Repeat reQuest) type, also called IR-HARQ (Incremental Redundancy HARQ) for that reason. In such a system, a information bit packet/is encoded using an error-correction code. During the first transmission of the packet over the channel, only certain parity bits, $P_1$, obtained for example by truncating the code, are transmitted with the information bits. If the recipient can not correct the errors in the packet using $P_1$, a retransmission request is sent to the sender. It may, depending on the type of implementation, send new parity bits or even all the remaining bits, $P_2$. The receiver then corrects the errors in the packet using the bits $P_1$ received in the first transmission and bits $P_2$ received in the second transmission. This process of retransmission can be iterated until all the code's parity have been transmitted. It is understood that $P_1, P_2, \ldots$ constitute redundancy increments of the code which are only sent one step at a time over the transmission channel, to the extent that they are needed for the correct reception of the packet.

Recently, an incremental redundancy coding method using LDPC codes was proposed in the article by P. Razaghi et al. entitled "Bilayer low-density parity check codes for decode-and-forward," published in *IEEE Trans. on Information Theory*, October 2007. More specifically, this coding method uses two LDPC codes $C_1$ and $C_2$, defined by two parity matrices $H_1$ and $H_2$, as illustrated in FIG. 4A. Code $C_1$ enables the generation of a sequence of parity bits $P_1$ from a sequence of information bits $I_1$. Code $C_2$ enables the generation of a sequence of parity bits $P_2$ from a sequence of information bits $I_2$. It is noted that the length of $I_2$ is equal to the sum of the lengths of $I_1$ and $P_1$.

In a cooperative network of the type illustrated in FIG. 3, the source terminal s encodes the information bits packet I using code $C_1$ and generates a sequence of parity bits, $P_1$. The source terminal then sends $(I, P_1)$ to the relay terminal r and the destination terminal d. The relay terminal r decodes the data received using code $C_1$ while correcting any transmission errors that might affect I and $P_1$. The relay terminal then encodes $(I, P_1)$ using code $C_2$ and transmits a packet of parity bits $P_2$ to the destination terminal d. The destination terminal consequently receives $(I, P_1)$ from the source terminal and $P_2$ from the relay terminal. It then decodes the packet $(I, P_1, P_2)$ using a new code C, with parity matrix H, obtained by concatenation of matrices $H_1$ and $H_2$, as illustrated in FIG. 4B.

Similarly, within an IR-HARQ type telecommunication system, a source terminal can encode a packet of information bits I using code $C_1$, thus generating a sequence of parity bits $P_1$. The source terminal sends the packet $(I, P_1)$ to the destination terminal. The destination terminal decodes the data received using code $C_1$, and thus correct any transmission errors that might affect I and $P_1$.

If the decoding is successful, the recipient recovers correctly the packet of information bits I, and the source terminal can continue with transmitting the next information packet. If the decoding fails, however, the destination terminal sends a retransmission request to the source terminal. It encodes the packet $(I, P_1)$ using code $C_2$ in FIG. 4 and transmits the new sequence of parity bits $P_2$ obtained from I and $P_1$. The destination terminal then decodes the packet $(I, P_1, P_2)$ using the concatenated code C, with parity matrix H, as before.

Concatenated LDPC code C has a lower efficiency (or throughput) than either of the constitutive elementary codes $C_1$ and $C_2$. In fact, if $R_1$ is the efficiency of code $C_1$ and $R_2$ is the efficiency of code $C_2$, the efficiency of concatenated code C is $R_1 R_2$. Correlatively, the correction power of code C is greater than that of either of the elementary codes $C_1$ and $C_2$.

The correction capability of an LDPC code is however very dependent on the density of nonzero elements in its check matrix. Thus, the weaker the efficiency of an LDPC code, the more its check matrix must be depleted. In other words, when placed at the same distance with respect to Shannon's theoretical limit, a low efficiency LDPC code must be less dense than a higher-efficiency LDPC code.

The construction of incremental redundancy LDPC codes, as proposed in the state of the art, leads to parity matrices having too high a density of nonzero elements.

Thus, the concatenation of LDPC codes as described in the aforementioned article, leads to a parity matrix H that is too dense due to the fact that the density of each of the elementary matrices $H_1$ and $H_2$ is greater than that of the parity matrix of a "good" LDPC code with efficiency $R_1 R_2$. In addition, as seen in FIG. 4, this density is not homogeneous, but is generally greater in matrix $H_1$ than in the rest of the matrix. Thus, matrix H inherits all the cycles of matrix $H_1$, though these could have been avoided if a "native" LDPC code with efficiency $R_1 R_2$ had been used. The existence of these cycles in matrix H leads to a deterioration in performance.

Contrarily, truncation of an LDPC code makes it possible to construct from an LDPC code of efficiency R a truncated LDPC code with efficiency $R_1 > R$, but the performance of the truncated code is degraded due to the presence in the associated graph of vertices that receive no information from the communication channel.

The problem at the root of the invention is to propose an LDPC coding method with incremental redundancy using an LDPC code yet not having the aforementioned disadvantages, that is to say implementing check matrices with low density and without short cycles.

DISCLOSURE OF THE INVENTION

The present invention is defined by a coding method with incremental redundancy in which it is determined whether to carry out encoding of a sequence of information symbols using a first, LDPC type code, defined by a first check matrix, H, or using a second code, with lower efficiency than that of the first code, in which:
the second code is defined by a second check matrix, $\tilde{H}$, obtained from the first check matrix by fractionating at least one parity check represented by one row of H into a plurality of partial parity checks applying to symbols of the first code and at least one additional symbol, by adding to the matrix H at least one new column representing said additional symbol and substituting for said row new rows representing respectively the partial parity checks;
said sequence of information symbols is encoded using the first code or the second code, depending on the result of the determination.

The encoding of said sequence of information symbols is carried out using the first code to obtain a first code word X and the encoding of the same sequence using the second code is carried out by finding code word $\tilde{X}$ satisfying $\tilde{H}\tilde{X}=0$ and $\tilde{X}|_E=X$ where $\tilde{X}|_E$ represents the restriction of $\tilde{X}$ to columns present in H.

According to a first variant, the coding method provides all the symbols of the code word obtained by encoding said sequence of information symbols using the second code.

According to a second variant, the coding method provides all the symbols of said information sequence and the additional symbol(s) corresponding to the column(s) in the second check matrix which is (are) not present in the first check matrix.

According to a third variant, it provides only the additional symbol(s) corresponding to the column(s) of the second check matrix which is (are) not present in the first check matrix.

The number of fractionated rows can be selected according to the state of the communication channel over which the sequence of information symbols is to be transmitted.

The rows can also be fractionated with the same degree of fractionation and this degree of fractionation can be selected in relation to a state of the communication channel on which the sequence of information symbols is to be transmitted.

The invention also relates to a link adaptation method of communication between a source terminal and a destination terminal, a packet of information symbols being transmitted over said link by the source terminal using a first modulation and encoding scheme using a first LDPC type code, defined by a first check matrix H and, if the quality of the link is poor, using a second modulation and encoding scheme defined by a second check matrix $\tilde{H}$. The second check matrix is obtained by fractionating at least one parity check represented by a row of matrix H into a plurality of partial parity checks applying to code symbols of the first code and at least one additional symbol, by adding to matrix H at least one column representing said additional symbol and by substituting for said row new rows respectively representing these partial parity checks.

Said packet of information symbols can be encoded using the first code to obtain a first code word X and encoding the same packet using a second code ($\tilde{C}$) by finding the code word $\tilde{X}$ satisfying $\tilde{H}\tilde{X}=0$ and $\tilde{X}|_E=X$ where $X|_E$ represents the restriction of $\tilde{X}$ to columns present in H.

The invention further relates to a method for turbo-coding a packet of information symbols in which said packet is supplied in systematic form in one branch of the turbo-code, said packet is encoded using a first LDPC type systematic code defined by a first check matrix H. The parity symbols of the packet thus encoded are provided in a second branch of the turbo-code and said packet is encoded, after being interleaved, using a second code, defined by a second check matrix $\tilde{H}$. The parity symbols of the packet thus encoded are supplied in a third branch of the turbo-code. Said second check matrix is obtained by fractionating at least one parity check represented by a row of matrix H into a plurality of partial parity checks applying to symbols of the first code and at least one additional symbol, by adding to this matrix at least one new column representing said additional bit, and by substituting for said row new rows respectively representing these partial parity checks.

The invention further relates to a method for transmitting packets within a cooperative type communication including a source terminal, a destination terminal and at least one relay terminal, in which:
the source terminal encodes a packet of information symbols, I, using a first code, C, of the LDPC type and with check matrix H, and transmits the packet thus encoded to the relay terminal as well as to the destination terminal;
the relay terminal decodes the data received to recover said packet and encodes the recovered packet using a second code defined by a check matrix $\tilde{H}$, said matrix $\tilde{H}$ being obtained by fractionating at least one parity check represented by a row of matrix H into a plurality of partial parity checks applying to symbols of the first code and at least one additional symbol, by adding to this matrix at least one column representing said additional symbol and by substituting for said row new rows respectively representing these partial parity checks;
the relay terminal transmits to the destination terminal at least the additional symbols corresponding to the columns of the second check matrix which are not present in the first check matrix.

According to a variant, the relay terminal transmits all the symbols of the packet encoded using the second code.

The relay terminal can in addition transmit to the destination terminal said recovered packet.

The number of fractionate rows and/or their degree of fractionation can depend on the state of the communication channel between the relay terminal and the destination terminal and/or the state of the communication channel between the source and the recipient.

The invention also relates to a method for transmitting packets within a cooperative type communication network including a source terminal, a destination terminal and a plurality of relay terminals, in which:
the source terminal encodes a packet of information symbols, I, using a first code, C, of the LDPC type and with check matrix H, and transmits the packet thus encoded to the relay terminals as well as to the destination terminal;
every relay terminal decodes the received data to recover said packet and encodes the recovered packet using a second code defined by a check matrix $\tilde{H}$, said matrix $\tilde{H}$ being obtained from H by fractionating at least one parity check represented by a row of matrix H into a plurality of partial parity checks on symbols of the first code and a set of additional symbols, by adding to matrix H a plurality of columns representing this set of additional symbols and by substituting for said row new rows respectively representing these partial parity checks;

every relay terminal transmits to the destination terminal a subset of the additional symbols corresponding to the columns of the second check matrix that are not present in the first check matrix, the subsets from two separate relays being disjoint.

The sizes of the various subsets can be determined centrally by the source terminal.

According to one advantageous variation, the recombination of said subsets constitutes said set of additional symbols and the size of said set is determined by the source terminal.

The invention also relates to a method for transmitting a packet of information bits within a telecommunication system using and IR-HARQ protocol in which a source terminal transmits, in a first step, said coded packet to a destination terminal using a first code of the LDPC type, defined by a first check matrix H, in which, at the request of the destination terminal, the source terminal:

encodes said packet of information bits using the second code defined by a second check matrix obtained by fractionating at least one parity check represented by a row of matrix H into a plurality of partial parity checks applying to bits of the first code and at least one additional bit, by adding to the matrix H at least one column representing said additional bit, and additional rows respectively representing these partial parity checks;

transmits in a second step to the destination terminal the additional bits corresponding to the columns of the second check matrix which are not present in the first check matrix.

BRIEF DESCRIPTION OF THE DRAWINGS

FIGS. 5A and 5B respectively show an example of a code's check matrix and a matrix obtained by fractionating it;

DETAILED DISCLOSURE OF SPECIFIC EMBODIMENTS

Figure 1:
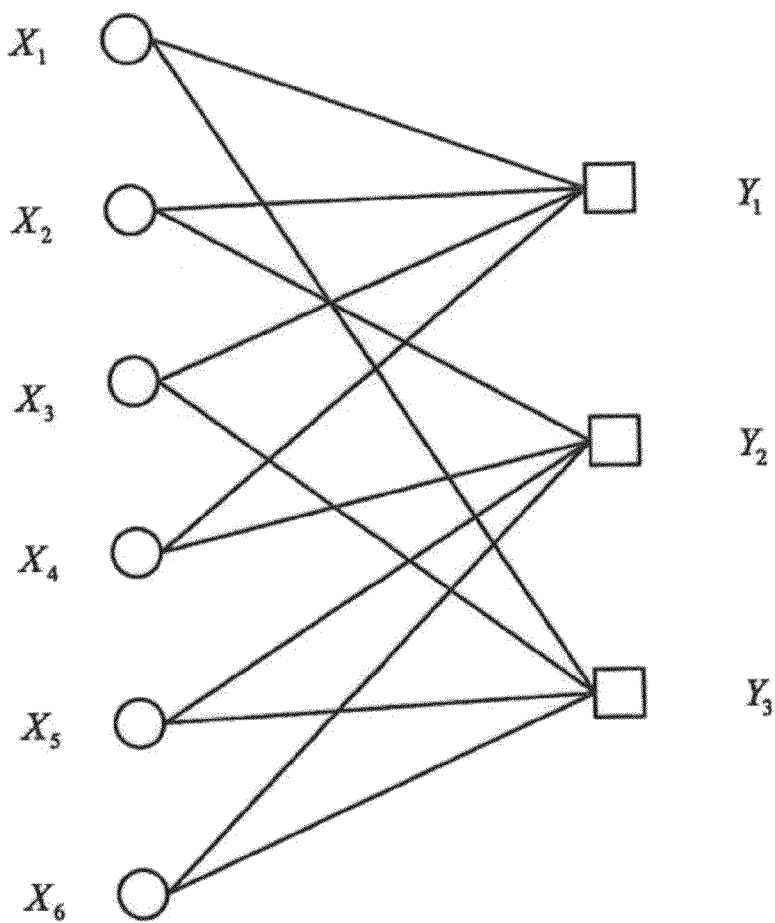
FIG. 1 shows an example of a bipartite graph associated with a binary LDPC code.
Figure 2:
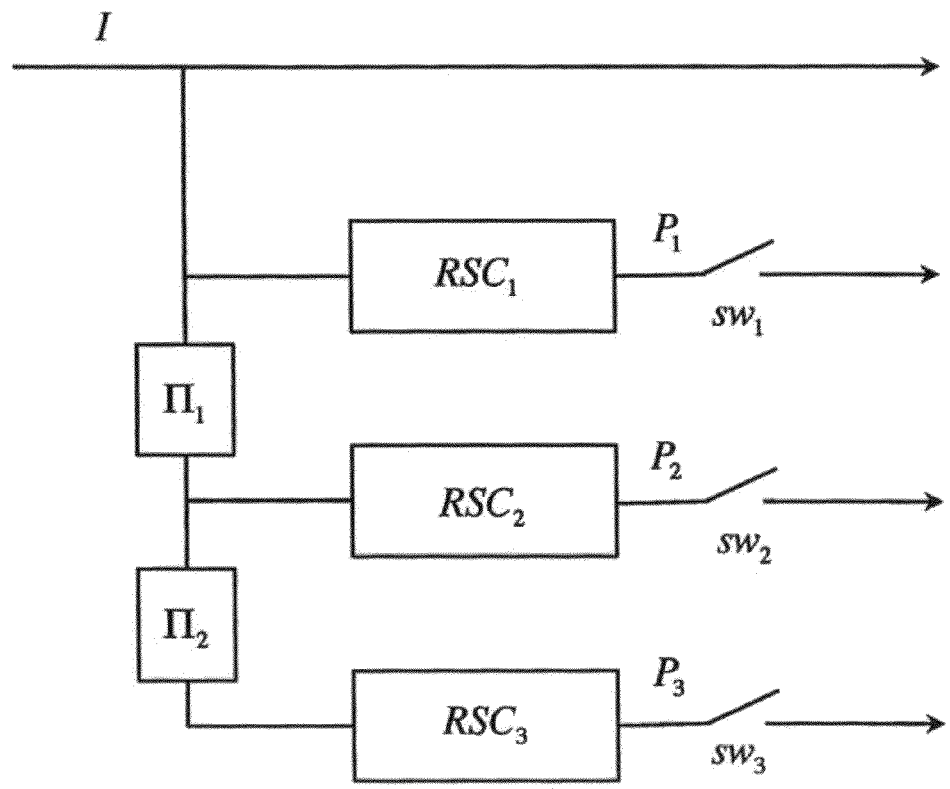
FIG. 2 shows schematically an example of turbo-coding with incremental redundancy.
Figure 3:
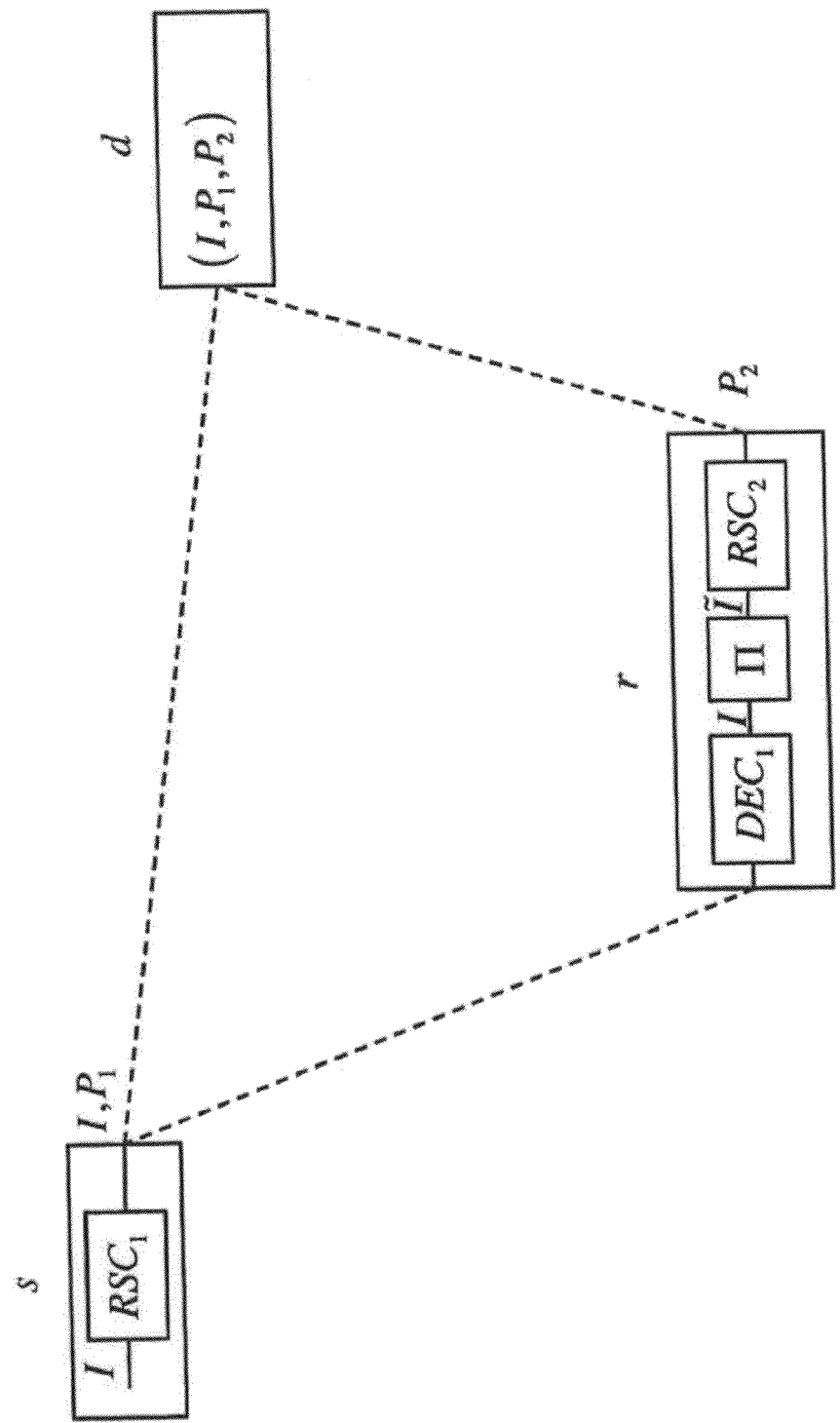
FIG. 3 shows schematically an example of transmission within a cooperative network.
Figure 4A:
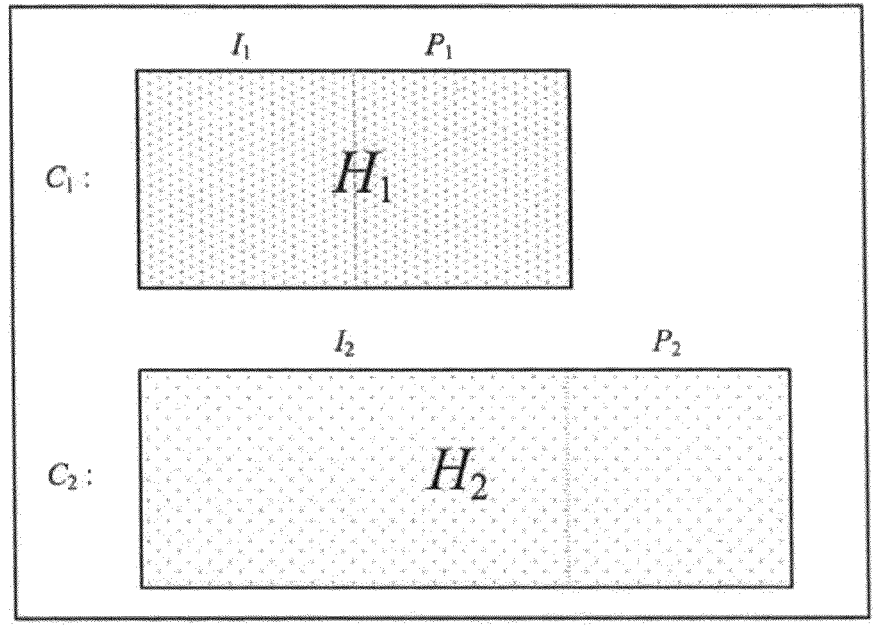
FIGS. 4A and 4B schematically show check matrices used for a coding method using concatenated LDPC codes.
Figure 4B:
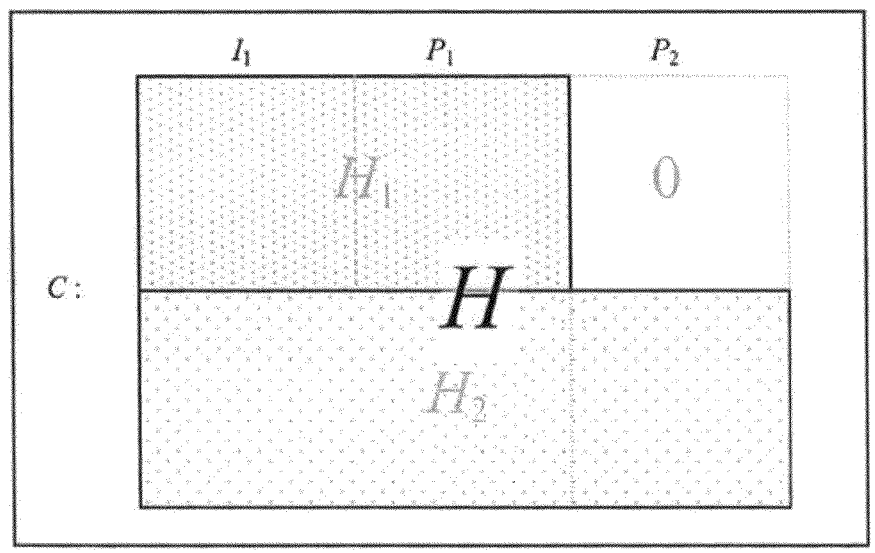

In what follows, we consider a binary or non-binary LDPC code with check matrix H.

For the purpose of facilitating understanding of the invention, the construction of an LDPC with incremental redundancy will first of all be illustrated by a specific case.

Let the code C be defined by the check matrix H:

$$\begin{array}{cccccccc|cccccccc}
i_1 & i_2 & i_3 & i_4 & i_5 & i_6 & i_7 & i_8 & p_1 & p_2 & p_3 & p_4 & p_5 & p_6 & p_7 & p_8 \\
1 & & 1 & 1 & & & 1 & & 1 & & & & & & & \\
& 1 & & 1 & & 1 & & 1 & 1 & 1 & & & & & & \\
1 & 1 & & & 1 & & & 1 & & 1 & 1 & & & & & \\
& & & 1 & & 1 & 1 & 1 & & & 1 & 1 & & & & \\
& 1 & & & 1 & 1 & 1 & & & & & 1 & 1 & & & \\
1 & 1 & & 1 & & & & 1 & & & & & 1 & 1 & & \\
1 & & 1 & & 1 & & 1 & & & & & & & 1 & 1 & \\
& & 1 & 1 & & 1 & & 1 & & & & & & & 1 & 1 \\
\end{array} \quad (1)$$

in which a vertical line has been used to distinguish the left portion relating to information bits and the right portion relating to parity bits. More specifically, the first eight columns of the matrix correspond to the eight bits of the information sequence $I=(i_1, i_2, \ldots, i_8)$ and the last eight columns correspond to the eight bits of the parity sequence $P=(p_1, p_2, \ldots, p_8)$. The empty cells in the matrix (1) correspond to zero values. The other elements define parity equations satisfied by the sixteen bits of the code word $c=(I,P_1)$. Thus the first row of matrix H expresses the constraint:

$$i_1+i_3+i_4+i_7+p_1=0 \quad (2)$$

And similarly, the second line expresses the constraint:

$$i_2+i_4+i_6+i_8+p_1+p_2=0 \quad (3)$$

A new check matrix, denoted $\tilde{H}$, is constructed by "fractionating" the parity checks of matrix H. In this example, each parity check (that is each row of H) is split to give two rows of $\tilde{H}$. It will of course be understood that a row of a check matrix H can be split so as to generate several rows of $\tilde{H}$.

The process is begun by splitting the parity check associated with the first row of H. To do this, two nonzero elements of the first row, corresponding here to information bits $i_3$ and $i_4$, are moved to a new row:

$$\begin{array}{cccccccc|cccccccc}
i_1 & i_2 & i_3 & i_4 & i_5 & i_6 & i_7 & i_8 & p_1 & p_2 & p_3 & p_4 & p_5 & p_6 & p_7 & p_8 \\
1 & & & & & & 1 & & 1 & & & & & & & \\
& 1 & & 1 & & 1 & & 1 & 1 & 1 & & & & & & \\
1 & 1 & & & 1 & & & 1 & & 1 & 1 & & & & & \\
& & & 1 & & 1 & 1 & 1 & & & 1 & 1 & & & & \\
& 1 & & & 1 & 1 & 1 & & & & & 1 & 1 & & & \\
1 & 1 & & 1 & & & & 1 & & & & & 1 & 1 & & \\
1 & & 1 & & 1 & & 1 & & & & & & & 1 & 1 & \\
& & 1 & 1 & & 1 & & 1 & & & & & & & 1 & 1 \\
\end{array} \quad (4)$$

A matrix augmented by an additional row is then obtained:

$$
\begin{array}{cccccccc|cccccccc}
i_1 & i_2 & i_3 & i_4 & i_5 & i_6 & i_7 & i_8 & p_1 & p_2 & p_3 & p_4 & p_5 & p_6 & p_7 & p_8 \\
1 & & & & & & 1 & & 1 & & & & & & & \\
 & 1 & & & 1 & 1 & & 1 & 1 & 1 & & & & & & \\
1 & 1 & & 1 & & & & 1 & & 1 & 1 & & & & & \\
 & & 1 & & 1 & 1 & 1 & & & & 1 & 1 & & & & \\
 & 1 & & & 1 & 1 & 1 & & & & & 1 & 1 & & & \\
1 & 1 & 1 & & & 1 & & & & & & & 1 & 1 & & \\
1 & & 1 & 1 & 1 & & & & & & & & & 1 & 1 & \\
 & 1 & 1 & & 1 & & 1 & & & & & & & & 1 & 1
\end{array}
\quad (5)
$$

The parity check expressed by (2) can be equivalently rewritten:

$$i_1 + i_7 + p_1 = q_1$$

$$i_3 + i_4 = q_1 \quad (6)$$

by introducing a new parity bit $q_1$. In other words, the parity check (2) is now split into two "partial" parity checks:

$$i_1 + i_7 + p_1 + q_1 = 0 \quad (7\text{-}1)$$

$$i_3 + i_4 + q_1 = 0 \quad (7\text{-}2)$$

which is expressed by a new check matrix, having an additional column:

$$
\begin{array}{cccccccc|cccccccc|c}
i_1 & i_2 & i_3 & i_4 & i_5 & i_6 & i_7 & i_8 & p_1 & p_2 & p_3 & p_4 & p_5 & p_6 & p_7 & p_8 & \\
1 & & & & & & 1 & & 1 & & & & & & & & 1 \\
 & 1 & & & 1 & 1 & & 1 & 1 & 1 & & & & & & & \\
1 & 1 & & 1 & & & & 1 & & 1 & 1 & & & & & & \\
 & & 1 & & 1 & 1 & 1 & & & & 1 & 1 & & & & & \\
 & 1 & & & 1 & 1 & 1 & & & & & 1 & 1 & & & & \\
1 & 1 & 1 & & & 1 & & & & & & & 1 & 1 & & & \\
1 & & 1 & 1 & 1 & & & & & & & & & 1 & 1 & & \\
 & 1 & 1 & & 1 & & 1 & & & & & & & & 1 & 1 & \\
 & & & & & & & & & & & & & & & & 1
\end{array}
\quad (8)
$$

The first element of the column relating to $q_1$ expresses the first partial parity check defined in (7-1), the ninth element of this column expresses the second parity check defined in (7-2). The process can be continued with the second row, by moving for example three nonzero elements of this row corresponding to information bits $i_2$, $i_6$ and to parity bit $p_1$:

$$
\begin{array}{cccccccc|cccccccc|c}
i_1 & i_2 & i_3 & i_4 & i_5 & i_6 & i_7 & i_8 & p_1 & p_2 & p_3 & p_4 & p_5 & p_6 & p_7 & p_8 & \\
1 & & & & & & 1 & & 1 & & & & & & & & 1 \\
 & & & & 1 & & & 1 & & 1 & & & & & & & \\
1 & 1 & & 1 & & & & 1 & & 1 & 1 & & & & & & \\
 & & 1 & & 1 & 1 & 1 & & & & 1 & 1 & & & & & \\
 & 1 & & & 1 & 1 & 1 & & & & & 1 & 1 & & & & \\
1 & 1 & 1 & & & 1 & & & & & & & 1 & 1 & & & \\
1 & & 1 & 1 & 1 & & & & & & & & & 1 & 1 & & \\
 & 1 & 1 & & 1 & & 1 & & & & & & & & 1 & 1 & \\
 & & & & & & & & & & & & & & & & 1
\end{array}
\quad (9)
$$

A check matrix augmented by one additional row is thus obtained:

$$
\begin{array}{cccccccc|cccccccc|c}
i_1 & i_2 & i_3 & i_4 & i_5 & i_6 & i_7 & i_8 & p_1 & p_2 & p_3 & p_4 & p_5 & p_6 & p_7 & p_8 & \\
1 & & & & & & 1 & & 1 & & & & & & & & 1 \\
 & & & & 1 & & & 1 & & 1 & & & & & & & \\
1 & 1 & & 1 & & & & 1 & & 1 & 1 & & & & & & \\
 & & 1 & & 1 & 1 & 1 & & & & 1 & 1 & & & & & \\
 & 1 & & & 1 & 1 & 1 & & & & & 1 & 1 & & & & \\
1 & 1 & 1 & & & 1 & & & & & & & 1 & 1 & & & \\
1 & & 1 & 1 & 1 & & & & & & & & & 1 & 1 & & \\
 & 1 & 1 & & 1 & & 1 & & & & & & & & 1 & 1 & \\
 & & & & & & & & & & & & & & & & 1
\end{array}
\quad (10)
$$

Parity check (3) can also be expressed in an equivalent manner in the form:

$$i_4 + i_8 + p_2 = q_2$$

$$i_2 + i_6 + p_1 = q_2 \quad (11)$$

In other words, parity check (3) is now split into two "partial" parity checks:

$$i_4 + i_8 + p_2 + q_2 = 0 \quad (12\text{-}1)$$

$$i_2 + i_6 + p_1 + q_2 = 0 \quad (12\text{-}2)$$

where $q_2$ is a new parity bit. This is expressed by the addition of an additional column to the check matrix:

$$
\begin{array}{cccccccc|cccccccc|cc}
i_1 & i_2 & i_3 & i_4 & i_5 & i_6 & i_7 & i_8 & p_1 & p_2 & p_3 & p_4 & p_5 & p_6 & p_7 & p_8 & & \\
1 & & & & & & 1 & & 1 & & & & & & & & 1 & \\
 & & & 1 & & & & 1 & & 1 & & & & & & & & 1 \\
1 & 1 & & 1 & & & & 1 & & 1 & 1 & & & & & & & \\
 & & 1 & & 1 & 1 & 1 & & & & 1 & 1 & & & & & & \\
 & 1 & & & 1 & 1 & 1 & & & & & 1 & 1 & & & & & \\
1 & 1 & 1 & & & 1 & & & & & & & 1 & 1 & & & & \\
1 & & 1 & 1 & 1 & & & & & & & & & 1 & 1 & & & \\
 & 1 & 1 & & 1 & & 1 & & & & & & & & 1 & 1 & & \\
 & & & & & & & & & & & & & & & & 1 & \\
 & & & & & & & & & & & & & & & & & 1
\end{array}
\quad (13)
$$

where the second (resp. the tenth) element of the column relating to $q_2$ expresses the first (resp. the second) partial parity check defined in (12-1) (resp. in (12-2)).

The fractionating process can be pursued and additional parity bits $q_3$ through $q_8$ created. On completion of the process, a check matrix $\tilde{H}$ is obtained:

$$\begin{array}{cccccccc|cccccccc|cccccccc}
i_1 & i_2 & i_3 & i_4 & i_5 & i_6 & i_7 & i_8 & p_1 & p_2 & p_3 & p_4 & p_5 & p_6 & p_7 & p_8 & & & & & & & & \\
1 & & & & 1 & & & & 1 & & & & & & & & 1 & & & & & & & \\
 & 1 & & & & 1 & & & & 1 & & & & & & & & 1 & & & & & & \\
 & & 1 & & & & 1 & & & & 1 & & & & & & & & 1 & & & & & \\
 & & & 1 & 1 & & & & & & & 1 & & & & & & & & 1 & & & & \\
 & & & & 1 & 1 & & & & & & & 1 & & & & & & & & 1 & & & \\
 & 1 & & 1 & & & & & & & & & & 1 & & & & & & & & 1 & & \\
1 & & & 1 & & & & & & & & & & & 1 & & & & & & & & 1 & \\
 & 1 & & & 1 & & & & & & & & & & & 1 & & & & & & & & 1 \\
\hline
 & & & & & & & & & & & & & & & & 1 & & & & & & & \\
 & & & & & & & & & & & & & & & & & 1 & & & & & & \\
 & & & & & & & & & & & & & & & & & & 1 & & & & & \\
 & & & & & & & & & & & & & & & & & & & 1 & & & & \\
 & & & & & & & & & & & & & & & & & & & & 1 & & & \\
 & & & & & & & & & & & & & & & & & & & & & 1 & & \\
 & & & & & & & & & & & & & & & & & & & & & & 1 & \\
 & & & & & & & & & & & & & & & & & & & & & & & 1
\end{array}$$ (14)

In the foregoing example, each parity check was split into two partial parity checks. As stated above, the fractionation can be of a higher degree. Thus the second row of matrix H can be split into three to give rise to three additional rows. For example, the matrix after the fractionation of the first line of (8) is considered and the nonzero elements of the second row corresponding to bits $i_2$ and $p_1$ are moved to a first additional row and those corresponding to its $i_6$ and $i_8$ to a second additional row:

(15) [matrix]

a new matrix is obtained:

(16) [matrix]

The parity check (3) can be equivalently expressed in the form of a system of equations:

$$i_4 + p_2 = q_2$$

$$i_2 + p_1 = q_3$$

$$i_6 + i_8 + q_2 + q_3 = 0 \qquad (17)$$

in other words, in the form of three partial parity checks:

$$i_4 + p_2 + q_2 = 0$$

$$i_2 + p_1 + q_3 = 0$$

$$i_6 + i_8 + q_2 + q_3 = 0 \qquad (18)$$

by introducing the two new parity bits $q_2$ and $q_3$. The check matrix then has two additional columns, as shown hereafter:

(19) [matrix]

It will be understood that different parity checks can be split into different numbers of partial checks. For example, the more nonzero elements a row has, the more finely it can be fragmented. Lines having a small number of nonzero elements can thus be obtained.

Conversely, it is always possible, if necessary, to add nonzero elements to the check matrix. For example, if the third row of H is split by moving the nonzero elements corresponding to bits $i_1$ and $i_8$ to a first additional row and the nonzero elements corresponding to bits $i_5$ and $p_2$ to a second additional row:

$$\begin{array}{cccccccc|cccccccc|c}
i_1 & i_2 & i_3 & i_4 & i_5 & i_6 & i_7 & i_8 & p_1 & p_2 & p_3 & p_4 & p_5 & p_6 & p_7 & p_8 \\
1 & & & & & & & & 1 & & & & & & & 1 \\
& 1 & & & & & & & & 1 & & & & & & 1 \\
1 & & & & & & & & & 1 & & & & & & \\
& & & 1 & 1 & 1 & 1 & & & & 1 & 1 & & & & \\
& 1 & & & & 1 & 1 & 1 & & & & 1 & 1 & & & \\
1 & 1 & & 1 & & & & 1 & & & & & 1 & 1 & & \\
1 & & 1 & & 1 & & & & & & & & & 1 & 1 & \\
& 1 & 1 & & & 1 & & & & & & & & & 1 & 1 \\
\hline
& & & & & & & & & & & & & & & 1 \\
& & & & & & & & & & & & & & & 1 \\
& & & & & & & & & & & & & & 1 & 1 \\
\end{array} \quad (20)$$

the new matrix:

$$\begin{array}{cccccccc|cccccccc|c}
i_1 & i_2 & i_3 & i_4 & i_5 & i_6 & i_7 & i_8 & p_1 & p_2 & p_3 & p_4 & p_5 & p_6 & p_7 & p_8 \\
1 & & & & & & & & 1 & & & & & & & 1 \\
& 1 & & & & & & & & 1 & & & & & & 1 \\
1 & & & & & & & & & 1 & & & & & & \\
& & & 1 & 1 & 1 & 1 & & & & 1 & 1 & & & & \\
& 1 & & & & 1 & 1 & 1 & & & & 1 & 1 & & & \\
1 & 1 & & 1 & & & & 1 & & & & & 1 & 1 & & \\
1 & & 1 & & 1 & & & & & & & & & 1 & 1 & \\
& 1 & 1 & & & 1 & & & & & & & & & 1 & 1 \\
\hline
& & & & & & & & & & & & & & & 1 \\
& & & & & & & & & & & & & & & 1 \\
& & & & & & & & & & & & & & 1 & 1 \\
\end{array} \quad (21)$$

is obtained.

The parity check corresponding to the third row of matrix H can be expressed in the following manner:

$$i_1 + i_2 + i_5 + i_8 + p_2 + p_3 = 0 \quad (22)$$

A variable can be inserted into constraint (22), for example the systematic information bit $i_3$:

$$(i_2 + p_3 + i_3) + (i_1 + i_8 i_3) + (i_5 + p_2) = 0 \quad (23)$$

thus, by introducing new parity bits $q_4 = i_2 + p_3 + i_3$ and $q_5 = i_1 + i_8 + i_3$:

$$i_2 + p_3 + i_3 + q_4 = 0 \quad (24\text{-}1)$$

$$i_1 + i_8 + i_3 + q_5 = 0 \quad (24\text{-}2)$$

$$i_5 + p_2 + q_4 + q_5 = 0 \quad (24\text{-}3)$$

It is noted that bit $i_3$ appears in the partial check (24-1) and that, correlatively, it also appears in the partial check (24-2). Check matrix H thus includes two additional columns respectively associated with $q_4$ and $q_5$. Unlike the preceding rows, a nonzero element has been introduced (here in the third and the twelfth rows of the matrix):

$$\begin{array}{cccccccc|cccccccc|cc}
i_1 & i_2 & i_3 & i_4 & i_5 & i_6 & i_7 & i_8 & p_1 & p_2 & p_3 & p_4 & p_5 & p_6 & p_7 & p_8 \\
1 & & & & 1 & & & & 1 & & & & & & & 1 \\
& 1 & & & & & & & & 1 & & & & & & 1 \\
1 & 1 & & & & & & & & 1 & & & & & & \\
& & & 1 & 1 & 1 & 1 & & & & 1 & 1 & & & & \\
& 1 & & & & 1 & 1 & 1 & & & & 1 & 1 & & & \\
1 & 1 & & 1 & & & & 1 & & & & & 1 & 1 & & \\
1 & & 1 & & 1 & & & & & & & & & 1 & 1 & \\
& 1 & 1 & & & 1 & & & & & & & & & 1 & 1 \\
\hline
& & & & & & & & & & & & & & & 1 \\
& & & & & & & & & & & & & & & 1 \\
& & & & & & & & & & & & & & 1 & 1 \\
& & & & & & & & & & & & & & & 1 \\
& & & & & & & & & & & & & & & 1 & 1 \\
\end{array} \quad (25)$$

In what follows, we will describe the general case of a coding method with incremental redundancy using a code whose check matrix is obtained by fractionation of the check matrix H of an LDPC code, C. This code is not necessarily binary, and consequently the elements of H can be elements of a Galois field with q elements, GF(q) or, more generally, elements of a group acting on the code's non-binary alphabet. The LDPC code is also not necessarily systematic, in other words the variables are not necessarily the information symbols themselves but more generally linear combinations of them (given by the code's generating matrix G). It will be noted that when the code is not systematic, the parity matrix H is not divided into a first part relating to the information symbols and a second part relating to the parity symbols, as in the foregoing example.

Matrix H is supposed to be of size M×N. Let there be a matrix $\tilde{H}$ of size $\tilde{M} \times \tilde{N}$ with $\tilde{M} \geq M$ and $\tilde{N} \geq N$. It can be said that rows $L_{i_1}, L_{i_2}, \ldots, L_{i_k}$ of $\tilde{H}$ are obtained by fractionation of a row $R_j$ of H if there exists a subset $E \subseteq [1:\tilde{N}] \equiv \{1, \ldots, \tilde{N}\}$, with cardinal N, such that:

$$L_{i_1} \oplus L_{i_2} \oplus \ldots \oplus L_{i_k}|_E = R_j \quad (26)$$

and $$L_{i_1} \oplus L_{i_2} \oplus \ldots L_{i_k}|_{[1:\tilde{N}] \backslash E} = 0 \quad (27)$$

where for all vectors $V = (v_1, \ldots, v_{\tilde{N}})$ of size $\tilde{N}$, we denote with $V|_E$ the vector of the N components of V whose indices are included in E and with $V|_{[1:\tilde{N}] \backslash E}$ the vector of the $\tilde{N} - N$ remaining components. The addition operation of the group acting on the code's non-binary alphabet has been denoted with $\oplus$, for example addition within the Galois field GF(q). It is recalled that this addition is nothing but the XOR (OR exclusive) operation in the binary case (q=2).

In what follows, we will refer to a fractionation operation as defined in (26) and (27), including one in which a new variable is inserted later as explained in connection with (25).

When conditions (26) and (27) are satisfied, it is also said that rows $L_{i_1}, L_{i_2}, \ldots L_{i_k}$ are obtained by a "k-fractionation" of row $R_j$, k being an integer strictly greater than 1 indicating the degree of fractionation.

Finally, it will be said that matrix $\tilde{H}$ is obtained by fractionation of matrix H, if there exists:

a partition of the set of $\tilde{M}$ rows of matrix $\tilde{H}$ into M disjoint subsets $\{L_{k_0}, \ldots, L_{k_1}\}, \{L_{k_1+1}, \ldots, L_{k_2}\}, \ldots, \{L_{k_{M-1}+1}, \ldots, L_{k_M}\}$ with $k_0 = 1$ and $k_M = \tilde{M}$;

and a subset $E \subseteq [1:\tilde{N}]$ with cardinal N;

such that $\forall m \in \{1, \ldots, M\}$:

$$L_{k_{m-1}+1} \oplus L_{k_{m-1}+2} \oplus \ldots L_{k_m}|_E = R_m \qquad (28)$$

and $$L_{k_{m-1}+1} \oplus L_{k_{m-1}+2} \oplus \ldots L_{k_m}|_{[1:\tilde{N}]\backslash E} = 0 \qquad (29)$$

where $R_m$ represents the m-th row of H. Thus, it is understood that a plurality of new rows $L_{k_{m-1}+1}, \ldots, L_{k_m}$ has been substituted for row $R_m$ of H.

It is noted that rows $R_m$ are not necessarily arranged consecutively. Similarly, $\{L_1, \ldots, L_{k_1}\}$ represents any $k_1$ distinct rows of matrix $\tilde{H}$, which are not necessarily consecutive. The same is true of $\{L_{k_1+1}, \ldots, L_{k_2}\}$, etc.

E represents the set of columns of $\tilde{H}$ already present in matrix H. The set E is consequently the set of columns corresponding to the primary variables (to the bits of original code C in the case of a binary code) or even, by stretching terminology, the set of primary variables. Similarly, $[1:\tilde{N}]\backslash E$ is the set of additional variables introduced by the fractionation process. Each additional column added to matrix H corresponds to an additional variable, that is to an additional symbol not belonging to code C.

Code $\tilde{C}$ defined by parity matrix $\tilde{H}$ is an extension of C in the sense that if $X=(X_1, \ldots X_{\tilde{N}})$ is the word in code $\tilde{C}$ then $X|_E$ is a word in code C. In other words, if $\tilde{H}X^T=0$ then $HX|_E=0$.

As an illustration, the parity matrix H of a code is shown in FIG. 5A, and the matrix $\tilde{H}$ obtained by fractionation of that matrix in FIG. 5B. It is noted here that:

rows $L_1$ and $L_2$ of $\tilde{H}$ are obtained by a 2-fractionation of row $R_1$ of H;

rows $L_3$, $L_4$ and $L_5$ of $\tilde{H}$ are obtained by a 3-fractionation of row $R_2$ of rows $L_6$, $L_7$ and $L_8$ of $\tilde{H}$ are obtained by a 3-fractionation of row $R_3$ of H;

rows $L_9$, $L_{10}$, $L_{11}$ and $L_{12}$ of $\tilde{H}$ are obtained by a 4-fractionation of row $R_4$ of H.

It is also noted that the density of nonzero elements of matrix $\tilde{H}$ is noticeably lower than that of matrix the bits in one row of H representing a parity check are now distributed over several rows.

More generally, and unlike the state of the art, check matrix $\tilde{H}$ does not contain the matrix H of the original code. The fractionation process makes it possible to reduce the density of nonzero elements in the check matrix while at the same time increasing the redundancy of the code. The fractionation process also makes it possible to break any cycles that might be present in matrix H. Consequently, code C defined by check matrix H has high correction capacity, associated with rapid convergence of the decoding process.

Figure 6:
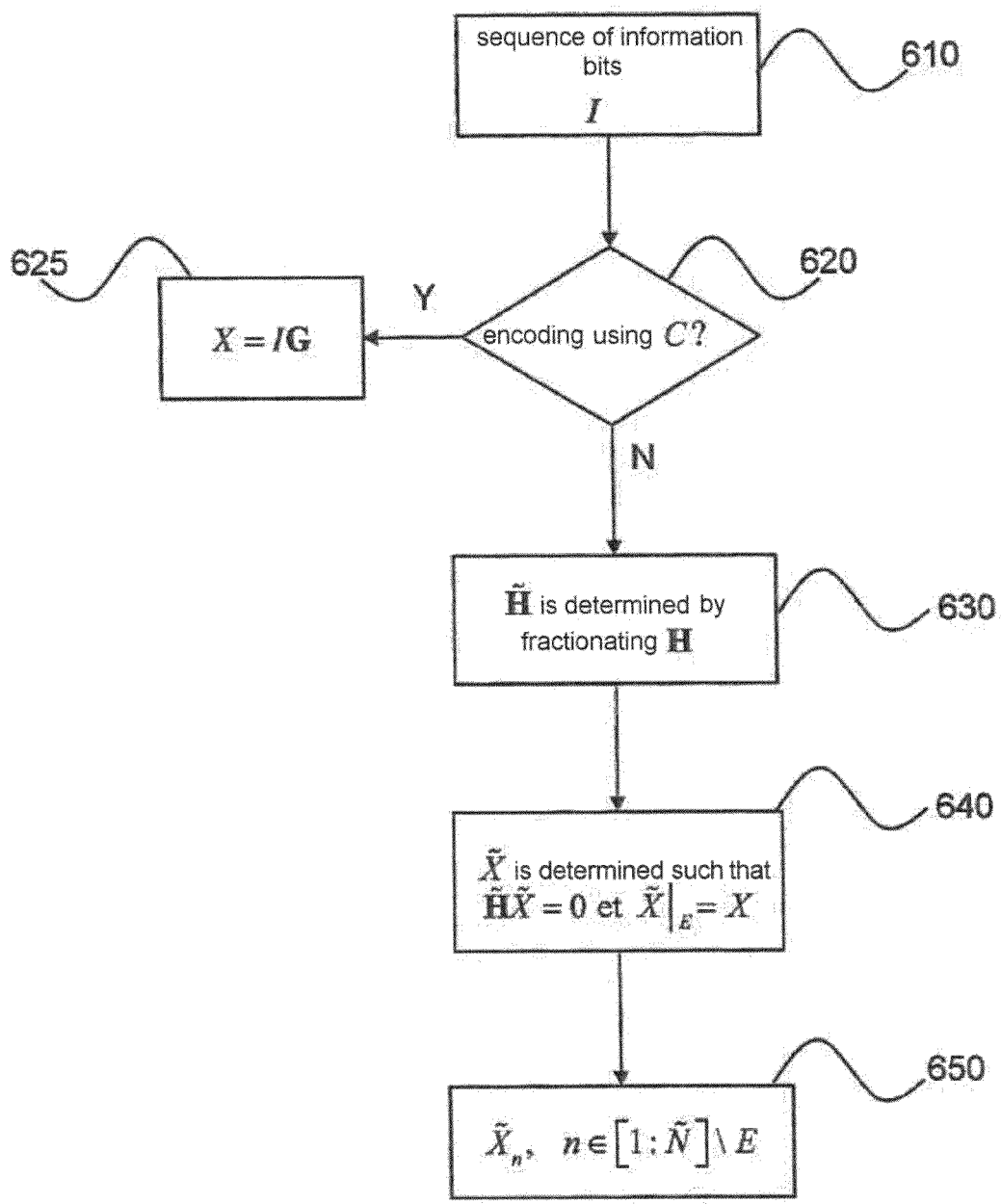
FIG. 6 shows schematically a coding method with incremental redundancy according to one embodiment of the invention.

FIG. 6 shows schematically a coding method with incremental redundancy according to one embodiment of the invention.

This coding method uses an LDPC type code C, defined by its check matrix H, or dually by its generating matrix G. It is known that the relation $HG^T=0$ connects one with the other. In the particular case where C is a systematic code, we have $G=(I_K|P)$ where K is the dimension of the code (number of information bits), $I_K$ the unit matrix of size K×K and P is a parity bit matrix of size K×(N−K) where N is the length of the code. The check matrix can be written in the form $H=(-P^T|I_{N-K})$, or in the case of a binary code $H=(P^T|I_{N-K})$ where $I_{N-K}$ is the unit matrix of size (N−K)×(N−K).

At step 610, a sequence of information symbols to be encoded, I, is available, represented in vector form.

At stage 620, it is determined whether the coding is carried out using the initial code C or using a code $\tilde{C}$ with a lower efficiency (or throughput) than C.

If encoding using C is satisfactory, the code word X=IG is supplied at 625. In the systematic case X=(I,P) where P=IP is the parity sequence.

In the opposite case, at stage 630, a check matrix $\tilde{H}$ is calculated by fractionation of matrix H as seen earlier. Different variations can be contemplated, according to whether all the rows of the matrix are fractionated or only some of them are, or whether or not the degree of fractionation differs from one row to another. The number of fractionated rows can depend on the state of the communication channel over which the information symbols are to be transmitted. Alternatively or cumulatively, the degree of fractionation of these rows can also depend on the state of the channel in question.

At step 640, the sequence of information symbols is encoded using code $\tilde{C}$ defined by matrix $\tilde{H}$. For this purpose, the code word $\tilde{X}$ of $\tilde{C}$ whose restriction to E is equal to X can be determined. Recall that E is the set of columns of $\tilde{H}$ present in H, in other words the vector $\tilde{X}$ is determined such that:

$$\tilde{H}\tilde{X}=0 \text{ and } \tilde{X}|_E=X \qquad (30)$$

An increment of redundancy is then provided in 650 in the form of a sequence of additional symbols $\tilde{X}_n$, $n\in[1:\tilde{N}]\backslash E$. Alternatively, all the symbols making up $\tilde{X}$ can be supplied at 650.

The process can be iterated in the sense that if encoding using $\tilde{C}$ proves insufficient, the fractionation of matrix H can be continued, either by fractionating rows not yet fractionated, or by increasing the degree of fractionation of rows already fractionated.

Fractionation can be advantageously continued starting with $\tilde{H}$. Codes $\tilde{C}_1, \tilde{C}_2, \ldots$ will thus be obtained, having ever greater redundancy, and therefore ever decreasing efficiency.

The incremental redundancy coding method can be implemented by a computer, and more generally by calculation means, distributed or not.

It is important to note that the calculation of matrix $\tilde{H}$ from H can be carried out dynamically by the coder as described previously, or it can have been carried out previously. In the second case in particular, the matrices H and $\tilde{H}$ may be stored in coder memory.

The incremental redundancy coding method can be applied to many telecommunication and other systems.

First of all, it can be implemented within the scope of a link adaptation telecommunication system. As is known, link adaptation is carried out by selecting a modulation and coding scheme or MCS to transmit data over the link. The destination terminal returns channel state information or CSI to the source terminal, expressed in terms of (a) communication channel attenuation coefficient(s), of signal-to-noise ratio or SNR, of bit-error rate or BER, of packet error rate or PER, etc. The source terminal selects for the next transmission the MCS scheme corresponding to the state of the channel. An MCS scheme is an ordered pair (σ,μ) made up of a σ and a modulation alphabet μ. Within the scope of a link adaptation transmission method according to one embodiment of the invention, the code σ can be selected from among a plurality of codes C, $\tilde{C}_1, \tilde{C}_2, \ldots$ where C is an LDPC code and $\tilde{C}_1, \tilde{C}_2$ are codes with increasing redundancy, obtained by successive fractionations of C.

Figure 7:
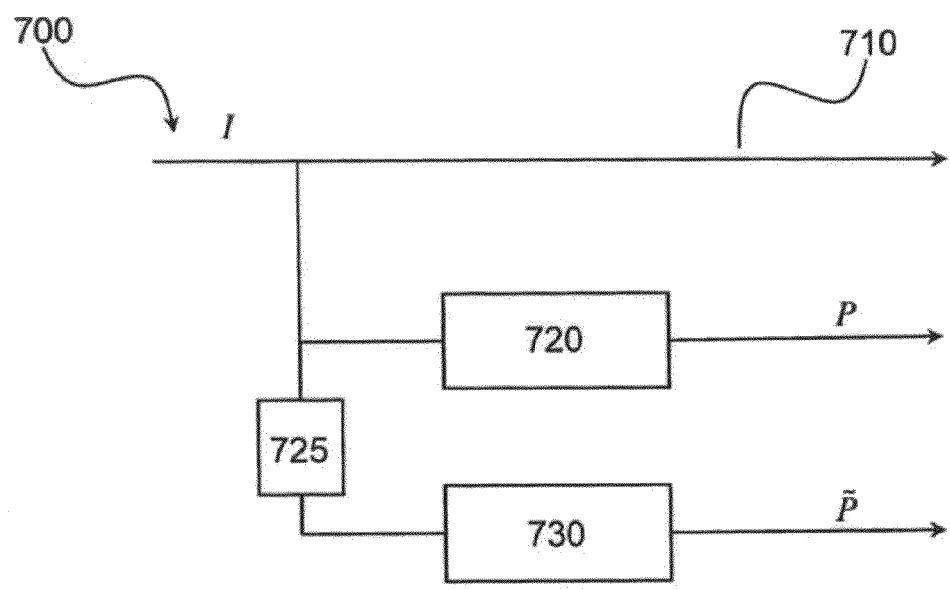
FIG. 7 shows schematically an adaptive turbo-coding process using an incremental redundancy coding method according to one embodiment of the invention.

The incremental redundancy coding method disclosed previously can also be applied to a turbo-coding system, as shown in FIG. 7.

The turbo-coder 700 in FIG. 7 includes a branch 710 directly transmitting the information bits I, a first coder, 720, encoding the information bits I using a systematic LDPC code, C, and supplying only the parity bits P, a second coder, 730, receiving the information bits after interleaving by the interleaver 725 and using a code $\tilde{C}$ obtained by fractionation of the check matrix H of code C as previously explained. The second coder provides the parity bits $\tilde{P}$ of code $\tilde{C}$ and the encoded packet $(I,P,\tilde{P})$ is transmitted over the communication channel. The degree of fractionation of code $\tilde{C}$ can be adaptively adjusted according to the state of the channel so that the encoded packet has a level of redundancy that varies incrementally.

Figure 8:
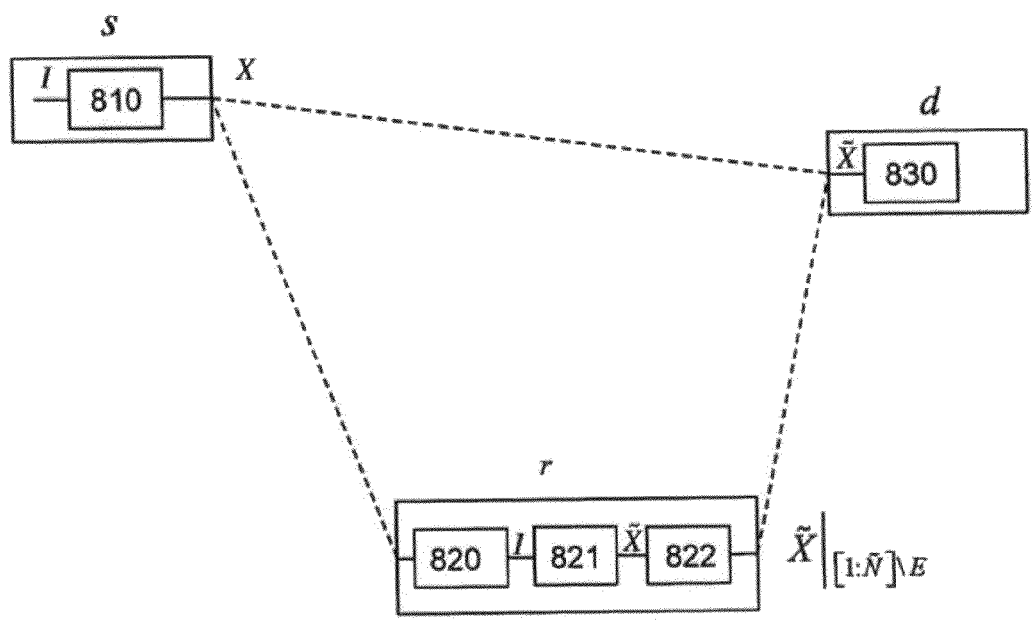
FIG. 8 shows schematically a cooperative transmission system using an incremental redundancy coding method according to one embodiment of the invention.

The incremental redundancy coding method previously disclosed can also be exploited for transmitting within a cooperative network, as shown in FIG. 8.

In this network, the source terminal s encodes at 810 a packet of information bits, I, using an LDPC code, C, with check matrix H. It thus generates a code word X and transmits it to the relay terminal r as well as to the destination terminal d.

The relay r decodes the received data at 820 using matrix H correcting any transmission errors that occur. It then generates at 821 a code word $\tilde{X}$ such that $\tilde{H}\tilde{X}=0$ and $\tilde{X}|_E=X$ where $\tilde{H}$ is the check matrix obtained by fractionation of H. The additional bits $\tilde{X}_n$, $n\in[1:\tilde{N}]\backslash E$ (where E is the set of columns of $\tilde{H}$ present in H) are then transmitted at 822 to the destination terminal.

The destination terminal d receives packet X from the source terminal and packet $\tilde{X}|[1:\tilde{N}]\backslash E$ from the relay terminal. The destination terminal therefore possesses (because $X=\tilde{X}|_E$) the full code word $\tilde{X}$ and can decode it at 830 using check matrix $\tilde{H}$.

In the general case, the coding method can use a matrix H made up of elements of GF (q). It applies equally whether code C is systematic or not.

Different embodiment variations of cooperative transmission can be contemplated.

First of all, the relay terminal r can transmit the full code word $\tilde{X}$ instead of confining itself to sending the additional bits. The destination terminal then receives $X=\tilde{X}|_E$ through two different channels, which makes it possible to improve the reliability of these bits.

Alternatively, the relay terminal r can transmit, in addition to the additional bits $\tilde{X}_n$, $n\in[1:\tilde{N}]\backslash E$, the information I that it decoded locally. The destination terminal then receives the code word $\tilde{X}$ as well as the systematic information I. This variation allows an increase in the signal-to-noise ratio for the information bits I, thereby improving the reliability of those bits.

Finally, if a plurality of relay terminals $r_l,\ldots,r_L$ is available to cooperate with the source terminal, each relay terminal $r_l$ can take charge of transmitting a subset $\Lambda_l$ of the additional bits $\tilde{X}_n$, $n\in[1:\tilde{N}]\backslash E$ such that:

$$[1:\tilde{N}]\backslash E = \bigcup_{l=1}^{L} \Lambda_l \qquad (31)$$

The destination terminal receiving the primary bits from the source terminal and the additional bits from the set of relay terminals can reconstitute the code word $\tilde{X}$ and decode it using check matrix $\tilde{H}$.

Alternatively, as before, each relay terminal $r_l$, $l=1,\ldots,L$, can transmit, in addition to its part $\Lambda_l$ of the additional bits, the information I which it will have decoded locally. The signal-to-noise ratio is thus significantly increased for the information bits I and the reliability of those bits is therefore increased.

In applying the coding method according to the invention to a cooperative network, it has been assumed that the code $\tilde{C}$ was defined by a predetermined fractionation of the matrix H. This fractionation, however, can be adaptive, and vary for example according to the state of the channel between the relay terminal r and the destination terminal d and/or the state of the channel between the source terminal s and the destination terminal d. More precisely, the relay can increase the degree of redundancy of code $\tilde{C}$ by further fractionating the matrix H if the state of the r-d channel and/or the s-d channel deteriorates. Control of fractionation can be carried out at the initiative of the relay terminal or under the control of the source terminal.

When several relay terminals $r_l,\ldots,r_L$ are cooperatively involved in the transmission, each relay terminal $r_l$ can be dynamically assigned a subset $\Lambda_l$ of greater or lesser size depending on the quality of the $r_l$-d channel. Further, it is also possible to vary the degree of redundancy of code $\tilde{C}$, by fractionating more or less the check matrix $\tilde{H}$, to provide for the overall quality of the relay channel. Control of fractionation, as well as of the sharing of the subsets $\Lambda_l$ is advantageously carried out centrally by the source terminal.

Finally, the incremental redundancy coding method according to the invention can be used in an IR-HARQ transmission system. A source terminal in such a system transmits, first, a packet of information bits I, encoding it using an LDPC, C, with check matrix H. In other words the source terminal transmits a code word X representing packet I. If the destination terminal is able to decode packet X, correcting if necessary any transmission errors using check matrix H, the source terminal continues transmission with the next information packet. On the other hand, if the packet cannot be decoded, the destination terminal will request a retransmission from the source terminal. It then proceeds with a second encoding of packet/using a code $\tilde{C}$ with check matrix $\tilde{H}$ obtained by fractionation of H as explained above and transmits only the additional bits $\tilde{X}_n$, $n\in[1:\tilde{N}]\backslash E$, where E is the set of columns of $\tilde{H}$ already present in H. If the decoder is still unable to decode the packet successfully, the incremental coding process can be iterated. In other words, the source terminal can encode the packet using codes $\tilde{C}_1,\tilde{C}_2,\ldots$ with increasing redundancy, obtained by successive fractionations of the parity matrix of C. More specifically, matrix $\tilde{H}$ itself can be fractionated to supply a new check matrix $\tilde{H}_1$ defining a new code $\tilde{C}_1$. Once again, only the additional bits $\tilde{X}_n$, $n\in[1:\tilde{N}_1]-E_1$ where $E_1$ is the set of columns of $\tilde{H}_1$ already present in $\tilde{H}$, are transmitted by the source terminal.

In the examples of application of the invention previously described, the matrix $\tilde{H}$ can either be dynamically calculated from the matrix H or have been previously calculated. In the second case in particular, the matrices H and $\tilde{H}$ can be stored in memory.

The invention claimed is:

1. A turbo-coding method for a packet of information symbols (I) in which, in a first branch of said turbo-code, said packet is supplied in systematic form, said packet being encoded using a first systematic code (C), of an LDPC (Low Density Parity Check) type, defined by a first check matrix H, parity symbols of the packet thus encoded being provided in a second branch of the turbo-code, said packet being encoded, after interleaving, using a second code ($\tilde{C}$), defined by a second check matrix $\tilde{H}$, the parity symbols of the packet thus encoded being supplied in a third branch of the turbo-code, wherein said second check matrix is obtained by fractionating at least one parity check represented by a row of matrix H into a plurality of partial parity checks applying to the symbols of the first systematic code and at least one additional symbol, by adding to this matrix H at least one new column representing said additional symbol and by substituting for said row new rows respectively representing these partial parity checks.

2. A method for transmitting packets within a communication network of the cooperative type including a source terminal, a destination terminal and at least one relay terminal, said method comprising:

the source terminal encoding a packet of information symbols, I, using a first code, C, of an LDPC (Low Density Parity Check) type and with check matrix H, and transmits the packet thus encoded to the relay terminal as well as to the destination terminal;

the relay terminal decoding the received data to recover said packet and encodes the recovered packet using a second code defined by a check matrix $\tilde{H}$, said matrix $\tilde{H}$ being obtained by fractionating at least one parity check represented by a row in matrix H into a plurality of partial parity checks applying to symbols of the first code and at least one additional symbol, by adding to matrix H at least one column representing said additional symbol and by substituting for said row new rows respectively representing these partial parity checks;

the relay terminal transmitting to the destination terminal at least the additional symbols corresponding to the columns of the second check matrix which are not present in the first check matrix.

3. A method of transmission according to claim 2, wherein the relay terminal transmits all the symbols of the packet encoded with the second code.

4. A transmission method according to claim 2 or 3, wherein the relay terminal also transmits said recovered packet to the destination terminal.

5. A transmission method according to claim 2, wherein a number of fractionated rows and/or a degree of fractionation thereof is/are dependent on a state of a communication channel between the relay terminal and the destination terminal and/or a state of a communication channel between the source and the destination.

6. A method for transmitting packets within a cooperative type communication network including a source terminal, a destination terminal and a plurality of relay terminals, said method comprising:

the source terminal encoding a packet of information symbols, I, using a first code, C, of an LDPC (Low Density Parity Check) type and with check matrix H, and transmits the packet thus encoded to the relay terminals as well as to the destination terminal;

each relay terminal decoding the received data to recover said packet and encodes the recovered packet using a second code defined by a check matrix $\tilde{H}$, said matrix $\tilde{H}$ being obtained from H by fractionating at least one parity check represented by a row of matrix H into a plurality of partial parity checks applying to symbols of the first code and a set of additional symbols, by adding to matrix H a plurality of columns representing this set of additional symbols and by substituting for said row new rows respectively representing these partial parity checks;

each relay terminal transmitting to the destination terminal a subset of the additional symbols corresponding to the columns of the second check matrix which are not present in the first check matrix, the subsets of two distinct relays being disjoint.

7. A packet transmission method according to claim 6, wherein sizes of the various subsets are determined centrally by the source terminal.

8. A packet transmission method according to claim 6 or 7, wherein a recombination of said subsets constitutes said set of additional symbols and a size of said set is determined by the source terminal.

* * * * *